United States Patent
Birth

[19]
[11] Patent Number: 6,144,842
[45] Date of Patent: *Nov. 7, 2000

[54] RADIO FREQUENCY LEVEL CONTROL CIRCUIT WITH REDUCED SUPPLY VOLTAGE

[75] Inventor: Winfrid Birth, Veitsbronn, Germany

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/960,384

[22] Filed: Oct. 29, 1997

[30] Foreign Application Priority Data

Nov. 5, 1996 [DE] Germany ............... 196 45 508

[51] Int. Cl.$^7$ ...................................... H03G 3/30
[52] U.S. Cl. .................. 455/71; 455/69; 455/192.1; 455/338
[58] Field of Search ................. 455/71, 69, 338, 455/341, 192.1, 232.1, 234.1, 250.1, 254, 31.3; 327/332, 333, 355, 356, 358

[56] References Cited

U.S. PATENT DOCUMENTS

| | | | |
|---|---|---|---|
| 5,291,150 | 3/1994 | Saarnimo et al. | 327/332 |
| 5,459,426 | 10/1995 | Hori | 327/332 |
| 5,557,228 | 9/1996 | Liu | 327/355 |
| 5,589,791 | 12/1996 | Gilbert | 327/356 |
| 5,627,486 | 5/1997 | Gross | 327/356 |
| 5,717,360 | 2/1998 | Vu et al. | 330/253 |
| 5,815,019 | 9/1998 | Uemura et al. | 327/202 |
| 5,826,182 | 10/1998 | Gilbert | 327/355 |
| 5,841,316 | 11/1998 | Shau | 327/355 |

*Primary Examiner*—Daniel S. Hunter
*Assistant Examiner*—Thuan T. Nguyen
*Attorney, Agent, or Firm*—Dicran Halajian

[57] ABSTRACT

A radio frequency level control circuit is disclosed having a level controller, a sensor and a variable gain amplifier which are located in a feedback path of the level controller. The level controller forms an output signal by mixing an input signal and a feedback signal in a Gilbert cell. The sensor forms a measuring signal and a reference signal from the output signal. The variable gain amplifier produces a feedback signal from a difference between the measuring signal and the reference signal. The Gilbert cell has a current mirror circuit which is configured to lower the supply voltage of the Gilbert cell and to reflect current from the first stage to the second stage. The current mirror circuit is located between a first stage and a second stage of the Gilbert cell, where the first stage is coupled to the feedback signal and the second stage is coupled to the input signal.

12 Claims, 5 Drawing Sheets

RADIO FREQUENCY LEVEL CONTROL CIRCUIT WITH REDUCED SUPPLY VOLTAGE

BACKGROUND OF THE INVENTION

The invention relates to a circuit arrangement for radio frequency level control, comprising a level controller for forming an output signal by mixing an input signal and a feedback signal in a Gilbert cell, a sensor in a feedback path for producing a measuring signal and a reference signal from the output signal, and a variable gain amplifier in the feedback path for producing the feedback signal from the difference between measuring signal and reference signal.

From 1995 IEEE International Solid State Circuits Conference (ISSCC 95), session 8, Wireless Communications, paper TA 8.7, pp. 148, 149, 354, 112, 113, 312 is known a GSM transceiver IC with on-chip filter. The paper describes how to control the IF transmission signal in a radio frequency circuit to a level of 50 mV, in that the radio frequency mixers are operated in their maximum linear range by an amplifier.

From DE 43 38 721 A1 is known a multiband radio device comprising a mixer in a multiband receiver. This mixer is provided for a conversion to an intermediate frequency via a mixing frequency, for which purpose a Gilbert cell mixer can be used, as appropriate (column 3, lines 52–56). Set off against a ring mixer with a respective mixing symmetry, which already provides sufficient attenuation of undesired spurious responses in the receiving band, the Gilbert cell mixer may be integrated.

More particularly in battery or accumulator-operated devices (for example, handhelds for mobile radio), it is interesting to reduce the supply voltage for a reduction of the energy consumption or for other device-specific reasons, as a result of which problems may occur when the state-of-the-art Gilbert cell mixer is operated.

OBJECTS AND SUMMARY OF THE INVENTION

Therefore, it is an object of the invention to provide a circuit arrangement which ensures the operation of a Gilbert cell as a radio frequency mixer while the supply voltage level is low.

This object is achieved with the circuit arrangement according to the invention in that at least one current mirror circuit is provided in the Gilbert cell between a first stage coupled to the feedback signal and a second stage coupled to the input signal. A Gilbert cell is generally formed by two coupled stages and works as a four-quadrant multiplier. The second (or upper) stage is then formed by two symmetrical differential amplifiers to whose cross-wise switched base terminals is coupled, for example, the radio frequency input signal. The pairwise coupled emitter terminals of the differential amplifiers are respectively connected to a collector terminal of one of the two transistors of the first (or lower) stage. The feedback signal and the inverted feedback signal are available on the base terminals of the two transistors. The two transistors of the first stage thus form a differential amplifier with negative current feedback. The collectors then represent the outputs of two current sources which are reverse-controlled as a result of, for example, the coupling of the feedback signal. In the circuit arrangement according to the invention for radio frequency level control, the feedback signal formed from the output signal should be mixed with the input signal, which two signals are to be coupled to either stage of the Gilbert cell. Between these stages is provided according to the invention at least one current mirror circuit with whose help the current is reflected from the lower stage into the upper stage. The two transistors of the first stage are then connected via a respective current mirror circuit to one of the two symmetrical differential amplifiers of the second stage. As a result, the Gilbert cell may be operated with a lower supply voltage. A parallel circuit comprising an appropriate number of transistors in the output branch of the current mirror circuit provides that integral multiples of the input current are generated. A suitable selection of the translation ratio may lead to a saving of current.

In a preferred embodiment of the invention, the current mirror circuit comprises at least two series-connected symmetrical current mirrors. The use of two successive current mirrors in a series combination provides more adjustable mirror factors and, more particularly, also larger translation ratios.

In a further embodiment, the current mirror circuit comprises a first current mirror formed by at least two pnp bipolar transistors and a second current mirror formed by at least two npn bipolar transistors. Besides the structures for the semiconductor elements in the current mirrors, it is also conceivable to use other components such as, for example, field effect transistors.

For an advantageous further embodiment of the invention and for controlling the first current mirror, a collector terminal and a base terminal of the first control transistor are coupled to the input signal of the current mirror, and an emitter terminal of the first control transistor is coupled to a constant power source, and a base terminal of a second control transistor is coupled to the input signal, a collector terminal of the second control transistor is coupled to a supply voltage and an emitter terminal of the second control transistor is coupled to the constant power source.

In a possible embodiment of the circuit arrangement according to the invention, in the sensor a part of the output signal produced by a voltage divider is used for forming the measuring signal and the reference signal. In this manner, the sensor may be used for arbitrary voltage levels of the output signal. By appropriately dimensioning the components of the voltage divider, an increased output signal power level provides that a level suitable for the sensor is generated. A voltage divider may be integrated in a highly suitable manner, but other forms of the voltage transformation are also conceivable.

The invention further relates to a mobile radio device comprising a circuit arrangement for radio frequency level control according to the invention, and a circuit arrangement for mixing two input signals.

These and other aspects of the invention will be apparent from and elucidated with reference to the embodiments described hereinafter.

DETAILED DESCRIPTION OF THE PREFERRED EMBODIMENT

In the embodiment shown, the radio frequency level control is used as an intermediate frequency (IF) amplifier in the transmit path of a GSM-standard mobile radio device. The output signal is an amplitude-controlled intermediate frequency signal IF1, or inverted intermediate frequency signal IF1X, respectively. The circuit arrangements are as symmetrical as possible for the signal and its inverted signal respectively, so that analogous descriptions in the following hold for the circuit section for the inverted signal having the suffix 'X'. Factorization digits of the elements shown feature a parallel combination of the denoted number of the same components. Especially with current mirrors, special translation factors evolve for the ratio of input current on the primary side to output current on the secondary side.

Figure 1:
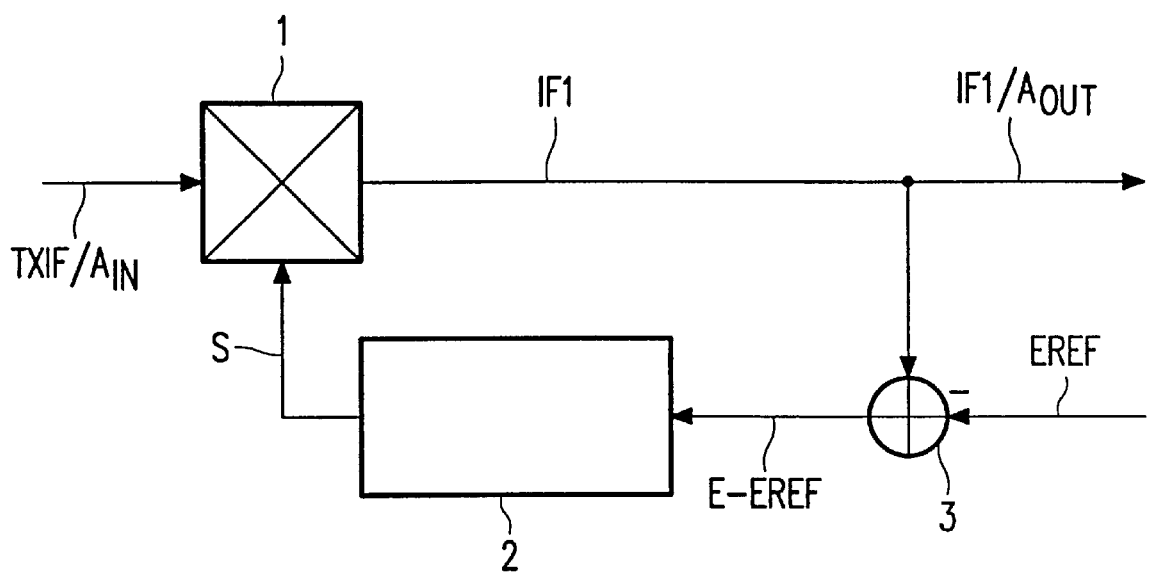
FIG. 1 shows a simplified block diagram of a general control loop including a feedback path.

FIG. 1 shows a block diagram of a control loop which may be used both in radio frequency level controllers in radio receivers and in mobile radio telephones. The control loop is formed by a level controller 1, a variable gain amplifier 2 in which often a filter is integrated, and a sensor 3. An output signal $A_{OUT}$ is to be amplitude-controlled to a reference signal. A boundary condition is then that with a substantially constant level for the sinusoidal radio frequency output signal $A_{OUT}$, the level of an input signal $A_{IN}$ may vary between boundaries that are wide apart. The output signal, here IF1/IF1X, is fed back and applied to the sensor 3. In the sensor 3, a measuring signal E and a reference signal EREF are formed from the IF1/IF1X signal and applied to the variable gain amplifier 2. In the variable gain amplifier 2, a feedback signal S, or inverted feedback signal SX respectively, is produced from the difference between the measuring signal and the reference signal E-EREF by amplification and filtering. This feedback signal S/SX is fed back to the control path via the level controller 1. In the level controller 1, for controlling the output signal IF1/IF1X to a certain amplitude, the feedback signal S/SX is mixed in a Gilbert cell with a symmetrical radio frequency input signal, in this case an uncontrolled, variable-amplitude intermediate frequency signal TXIF/TXIFX. The detailed embodiments of the level controller 1, of the variable gain amplifier 2, and of the sensor 3 will be explained hereinafter with reference to the drawing figures.

Figure 2:
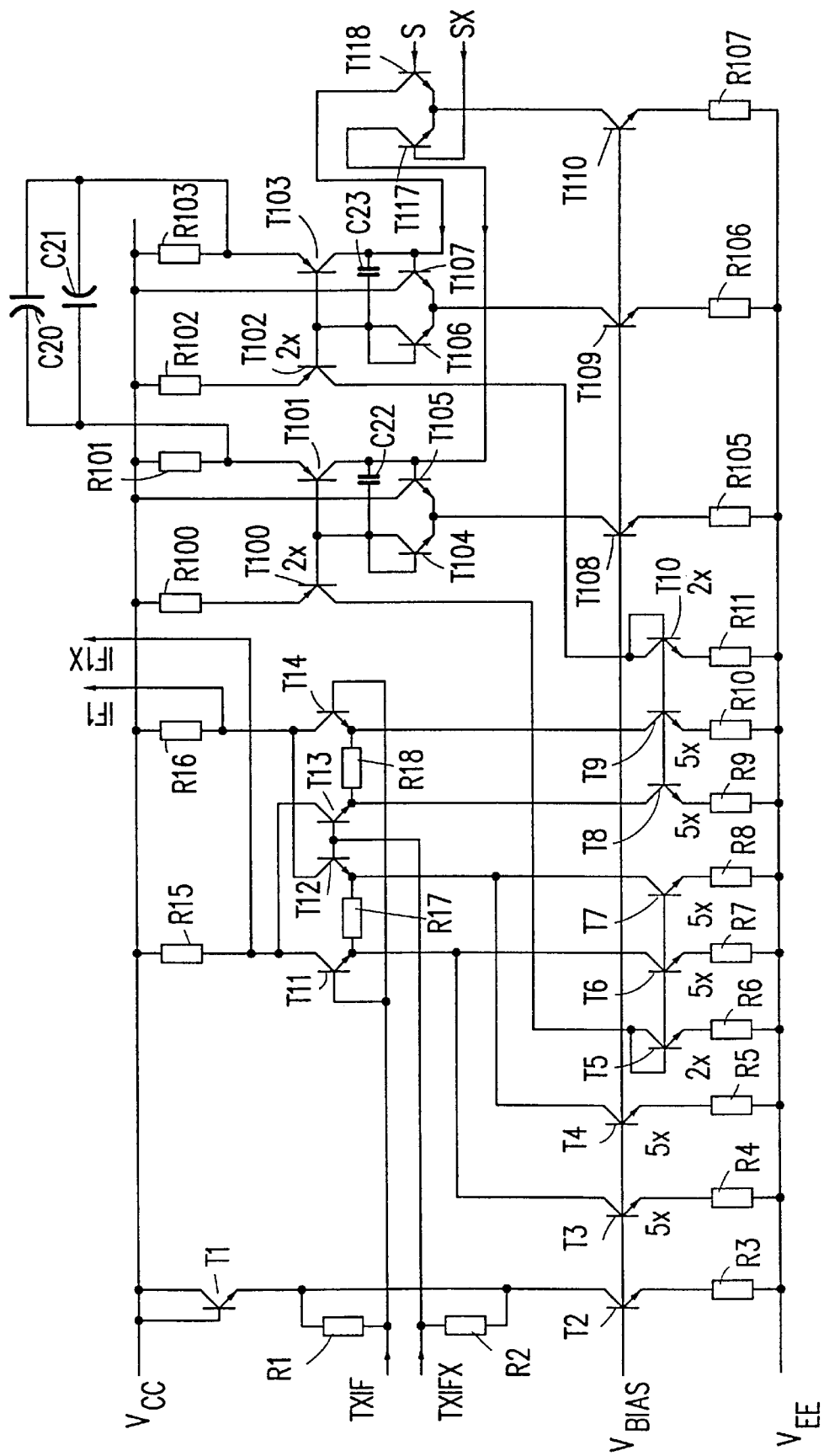
FIG. 2 shows a circuit diagram of the constructional realization of a level controller from the control loop.

FIG. 2 shows the constructional realization of the level controller 1. The uncontrolled intermediate frequency signal TXIF/TXIFX and the feedback signal S/SX are supplied and the output signal IF1/IF1X is produced therefrom. S and SX are each available on a base terminal of two npn transistors T118 and T117 whose emitter terminals are coupled to a collector terminal of an npn transistor T110. These two transistors form the lower stage of a Gilbert cell which is used as a mixer for radio frequency signals. The base terminal of the transistor T110 is connected to a reference voltage source $V_{BIAS}$ which is generated by a bandgap reference and controls in customary fashion constant current sources such as, for example, transistor T110. The emitter terminal of transistor T110 is connected to a reference voltage $V_{EE}$=0V via a resistor R107. In the following, only the path of the signal S is described, because a similar circuit section is shown in FIG. 2 for the symmetric signal SX. The collector terminal of the transistor T118 is connected both to the collector terminal of a pnp transistor T103 and, across a capacitor C23, to the base terminals of the transistor T103 and a pnp transistor T102. The emitter terminals of the transistors T103 and T102 are coupled via a respective resistor R103 and R102 to a supply voltage $V_{CC}$ which may lie in the 2.7V–5.5V range in the embodiment. For this purpose, the two pnp transistors T103 and T102 work as a current mirror which renders the signal S available on the collector terminal of transistor T102. This current mirror has a specific control which is formed by the npn transistors T106 and T107. The coupled emitter terminals thereof are connected to $V_{EE}$ via the collector-emitter path of an npn transistor T109 working like transistor T110 as a constant current source, and connected to a resistor R106. The signal S runs via the base terminal of the transistor T107 and is coupled to the base and collector terminal of the transistor T106 via the capacitor C23. The collector terminal of the transistor T107 is connected to the supply voltage $V_{CC}$. In symmetry with the part described, an appropriate circuit is inserted for the signal SX. The control of the pnp current mirror by a respective npn transistor pair makes it possible to use a smaller supply voltage (for example $V_{CC}$=2.7V). For optimizing the total loop frequency response and for the local stabilization, capacitors C20 and C21 are inserted. Here, the emitter terminals of the primary sides of the respective current mirrors for the signals S and SX are coupled via C20 and C21. As a result of the spurious substrate capacitances, C20 and C21 are connected antiparallel. This provides an enhanced symmetry. As an alternative to the solution shown, the resistor R103, R101 respectively, for the signal SX may be bridged by a respective capacitor between $V_{CC}$ and the emitter terminal. In that case, the capacitances for the capacitors are to be doubled. The capacitors C23 and C22 respectively, are used for optimizing the operation at the working point.

For the signal S and SX, a second npn current mirror is coupled to this controlled first pnp current mirror. For this purpose, the secondary side of the first current mirror, i.e. the collector terminal of the transistor T102, is connected both to the base and the collector terminal of an npn transistor T10 and to the base terminals of the npn transistors T8 and T9. The emitter terminals of the transistors T10, T8 and T9 are coupled to $V_{EE}$ via resistors R11, R9 and R10. For the inverted signal SX, the secondary side of the respective circuit section is connected in similar fashion to a second current mirror formed by npn transistors T5, T6 and T7. Their emitter terminals are connected to $V_{EE}$ via resistors R6, R7 and R8. The collector terminals of the transistors of the secondary side of the second current mirror are coupled to the upper stage of the Gilbert cell. All in all, this series combination formed by two respective symmetrical current mirrors makes it possible to reduce the supply voltage $V_{CC}$ to 2.7V. The pnp current mirror just like the npn current mirror have respective translation factors for saving current, for example, by connecting a plurality of transistors on the secondary side in parallel.

The upper stage of the Gilbert cell is formed by two npn transistor pairs T11 and T12 and T13 and T14. In the path for the signal S, the collector terminals of the transistors T8 and T9 are connected to the emitter terminals of the transistors T13 and T14. The latter two are further coupled via a resistor R18. Accordingly, in the signal path for the inverted signal SX, the transistors T6 and T7 are coupled to the transistors T11 and T12 and these are coupled via a resistor R17. The input signal TXIF is available on the base terminals of the transistors T14 and T11 and the inverted input signal TXIFX on the base terminals of the transistors T12 and T13. The collector terminals of the transistor pairs are connected crosswise, the output signal IF1 being tapped from the coupled collector terminals of the transistors T12 and T14 and the inverted output signal IF1X being tapped from the coupled collector terminals of the transistors T11 and T13. These nodes from which the output signal IF1 and IF1X are tapped, are connected to $V_{CC}$ via resistors R16 and R15, respectively. The level of the input signal may then vary in the range from 50 to 250 mV. The input signal TXIF/TXIFX is coupled to the emitter terminal of an npn transistor T1 via a resistor R1, R2, respectively. The collector and the base terminal of T1 are connected to $V_{CC}$. The emitter terminal of T1 is further coupled to the collector terminal of an npn transistor T2, whose base terminal is connected to $V_{BIAS}$. The emitter terminal of T2 is connected to $V_{EE}$ via a resistor R3.

A Gilbert cell is normally a four-quadrant multiplier. The possibility of being able to form the two signs in the result is not necessary when the Gilbert cell is used as a radio frequency mixer according to the invention in the level controller. Instead, it is necessary for a control never to have a changing sign. For this reason, the left-hand transistor pair T11 and T12 of the upper stage of the Gilbert cell is additionally coupled to the npn transistors T3 and T4. The base terminals of these transistors T3 and T4 are connected to the reference voltage source $V_{BIAS}$ and their emitter terminals are connected to $V_{CC}$ via resistors R4 and R5. This means that they work as constant current sources while the collector terminal of the transistor T3 is coupled to the emitter terminal of the transistor T11 and, accordingly, transistor T4 is coupled to transistor T12. This additionally discharged current leads to an intentional inclined position of the Gilbert cell and thus to an asymmetrical multiplier, to avoid a multiplication by zero. For this purpose, constant current sources T3 and T4 correlate so well with the constant current source formed by the transistor T110 in the lower stage of the Gilbert cell, that also in a boundary case as regards tolerance only the behavior of a two-quadrant multiplier is realized and the zero result is impossible. On the output of the level controller 1, shown in FIG. 2, the level-controlled output signal IF1 and IF1X occurs, the current ratio of transistor pair T11 and T12 to transistor pair T13 and T14 being responsible for the result. In the case of equal current, which case is avoided as described above, the result would be equal to zero due to the crosswise coupling of the collector terminals.

Figure 3:
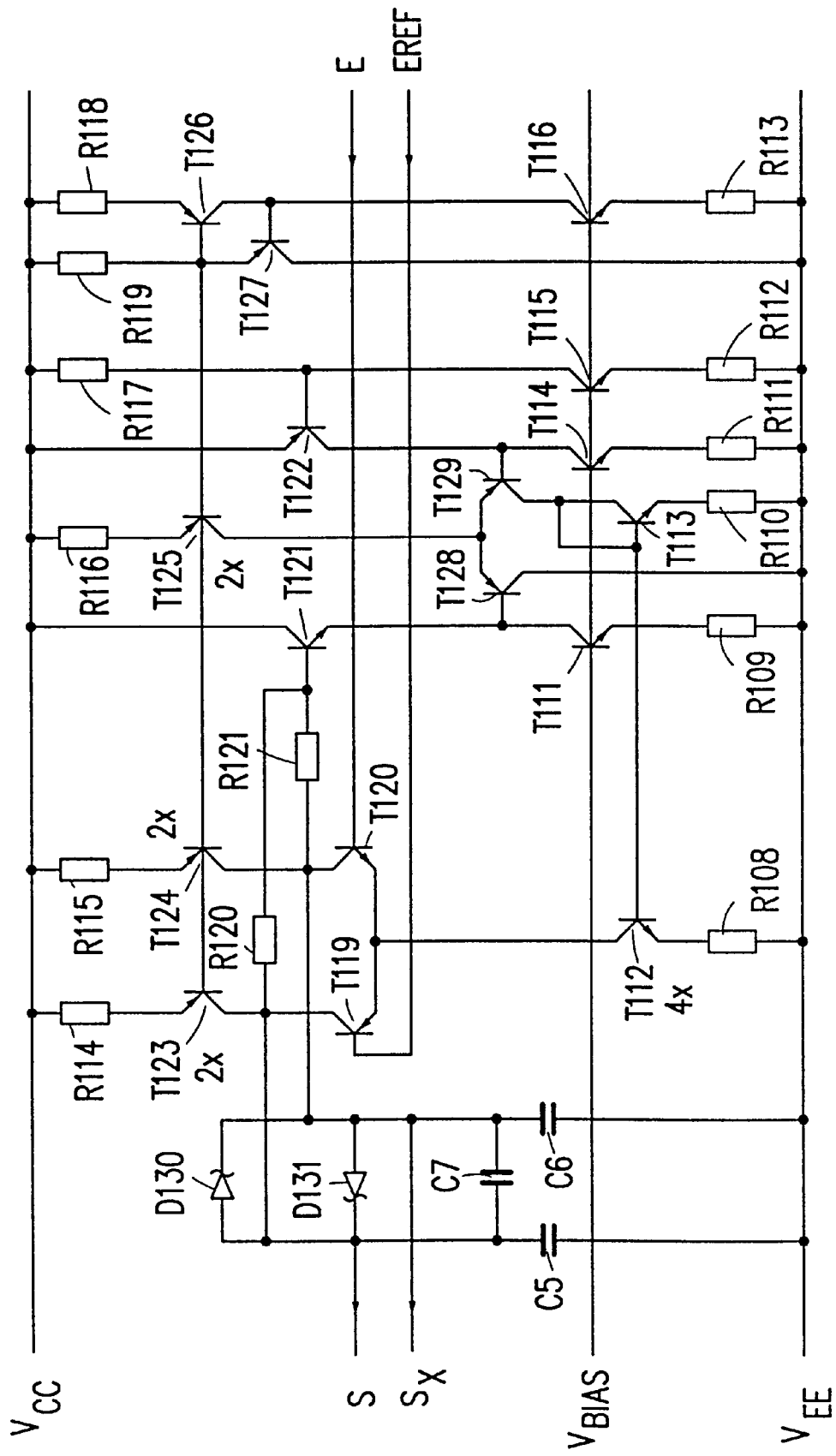
FIG. 3 shows a circuit diagram of a constructional realization of a variable gain amplifier of the control loop.

FIG. 3 shows the circuit for a variable gain amplifier 2 of the described embodiment of the invention. In the variable gain amplifier 2, the difference between measuring signal E and reference signal EREF is applied to a single-stage variable gain amplifier formed by npn transistors T119 and T120. The measuring signal E is coupled for this purpose to the base terminal of T120 and the reference signal EREF to the base terminal of T119. The outputs of the variable gain amplifier 2 produce the feedback signal S/SX, while the collector terminals of T120/T119 are connected to the base terminals of T117/T118 of FIG. 2, the latter two transistors forming the lower stage of the above Gilbert cell in the level controller 1. Again the supply voltage $V_{CC}$ and the reference voltage $V_{BIAS}$ are available as source voltages. An npn transistor T116 is coupled with its base terminal to the reference voltage $V_{BIAS}$ and with its emitter terminal to the reference voltage $V_{EE}$ via a resistor R113. The constant current source formed thus regulates the current for the variable gain amplifier 2, while the current is fed to the circuit via a current mirror formed by pnp transistors T123, T124, T125 and T126. Therefore, the collector terminal of the transistor T116 is connected to the collector terminal of the transistor T126 forming the primary side of the current mirror. The emitter terminal of the transistor T126 is coupled to the supply voltage $V_{CC}$ via a resistor R118. Furthermore, the collector of T116 is not directly coupled to the base terminal T126, but is connected to the base terminal of a pnp transistor T127. The collector terminal of T127 is connected to $V_{EE}$ and the emitter terminal to the base of T126 and also, via a resistor R119, to $V_{CC}$. The transistor T127 is thus an auxiliary transistor whose function is to improve the accuracy of the current mirror. The base terminals of the parallel-connected transistors T123, T124 and T125 are coupled to the base terminal of T126 and form the secondary side of the current mirror. The emitter terminals are connected to $V_{CC}$ via resistors R114, R115 and R116. The collector terminal of T123 is coupled to the collector terminal of T119 and the collector terminal of T124 is coupled to the collector terminal of T120. The emitter terminals of T119 and T120 are both connected to the collector terminal of an npn transistor T112. The collector terminal of T125 is connected to the emitter terminals of the pnp transistors T128 and T129 which form an auxiliary control loop. The collector terminal of T128 is connected to $V_{EE}$. The collector terminal of T129 is coupled to the collector and base terminals of an npn transistor T113 which forms the primary side of an npn current mirror formed by T113 and T112. For this purpose, the base terminal of T112 is also coupled to the collector of T129. The emitter terminals of T113 and T112 are connected to the reference voltage $V_{EE}$ via resistors R110 and R108.

Furthermore, an npn transistor T115 is used as a constant current source, whose base terminal is connected to $V_{BIAS}$ and emitter terminal is connected to $V_{ee}$ via a resistor R112. The collector terminal of T115 is connected to $V_{CC}$ via a resistor R117 which causes a constant voltage drop as a result of the constant current source. In this manner, there is a constant voltage available on the base terminal of an npn transistor T122 coupled to the collector terminal of T115, which constant voltage is used as a reference. The collector terminal T122 is connected to $V_{CC}$. The emitter terminal of T122 is coupled to the base terminal of T129 from the auxiliary control loop and to the collector terminal of an npn transistor T114. This transistor T114 also works as a constant current source, its base terminal being connected to $V_{BIAS}$ and its collector terminal being connected to $V_{EE}$ via a resistor R111. The base terminal of T128 is coupled to $V_{EE}$ via a further constant current source formed by an npn transistor T111 and via a resistor R109. Furthermore, the base terminal of T128 is coupled to the emitter terminal of an npn transistor T121 whose collector terminal is connected to $V_{CC}$. The base terminal of T121 is connected to the collector terminal of T119 via the resistor R120 and to the collector terminal of T120 via a resistor R121. Two anti-parallel diodes D130 and D131 which avoid the transistors in the variable gain amplifier 2 saturating are inserted between the collector terminals of T119 and T120. Since the collector terminals of T120 and T119 are further coupled each to a base terminal of the transistors T117 and T118, the diodes D130 and D131 also limit the control range in the lower stage of the Gilbert cell of the level controller 1. Furthermore, between the collector terminals of T119 and T120, and connected in parallel to the diodes D130 and D131 is inserted a capacitor C7 formed by two anti-parallel arranged capacitors. The collector terminal of T120, T119 respectively, is connected to $V_{EE}$ via a capacitor C6, C5, respectively.

The capacitors C5, C6 and C7 determine the magnitude of the frequency response of the control loop, i.e. particularly the drop at high frequencies (so-called roll-off). The capacitors C5 and C6 are used for stabilizing the auxiliary control loop formed by T128 and T129. The auxiliary control loop is necessary, because two respective current sources are connected back-to-back due to the coupling of the collector terminals of T119 and T123, and T120 and T124. For the potential of the nodes not to deviate too much from the condition of symmetry, the auxiliary control loop controls the current in T112 such that the average DC voltage on the base terminal of T121 matches the value on the base terminal of T122. This potential value is set as a reference value as described above. This avoids that with none of the transistors T119, T120, T123 and T124 the collector emitter voltage drops below 0.3V because of the shift of the potential in the nodes, and the respective transistor is thus saturated.

Figure 4:
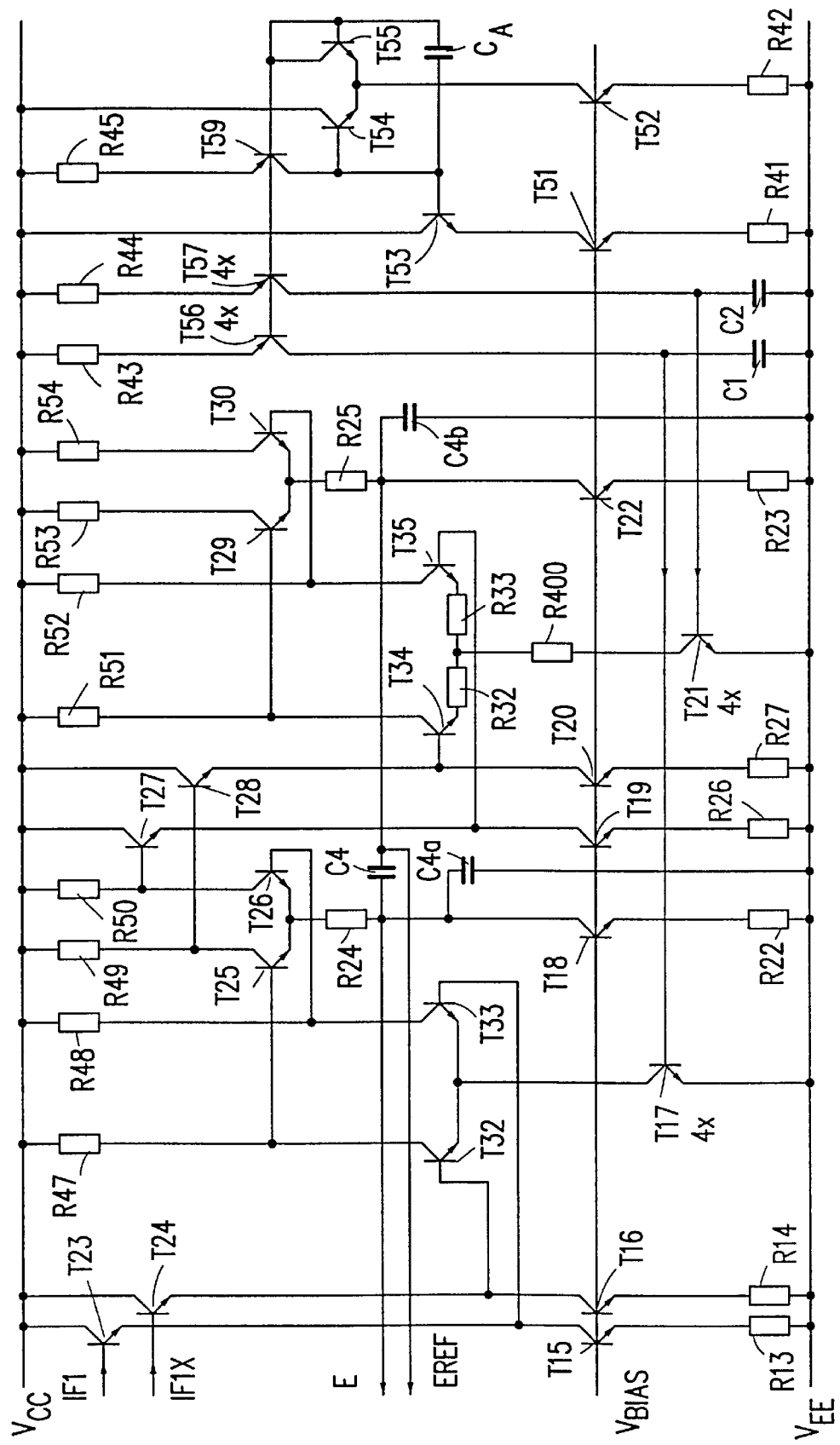
FIG. 4 shows a circuit diagram of the constructional realization of a sensor of the control loop.

A constructional realization of the sensor 3 of the embodiment of the radio frequency level controller according to the invention is shown in FIG. 4. The amplitude of the intermediate frequency signal IF1 or inverted intermediate frequency signal IF1X respectively, can be measured and compared to the reference signal. For this purpose, a measuring signal E and a reference signal EREF are generated in the sensor 3 in dependence on IF1/IF1X. The signal IF1/IF1X is available as an input signal on the base terminal of an emitter follower formed by an npn transistor T23, T24 respectively, whose respective collector terminals are coupled to the supply voltage $V_{CC}$. The emitter terminal of T23 is connected to the collector terminal of an npn transistor T15, whose base terminal is connected to the reference voltage source $V_{BIAS}$. The emitter terminal of this transistor T15 working as a constant current source is coupled to the reference voltage $V_{EE}$ via a resistor R13. Accordingly, in a symmetrical circuit section, an npn transistor T16 and a resistor R14 produce a constant current for the emitter terminal of T24.

The emitter terminal of T23, T24 respectively, is furthermore connected to the base terminal of an npn transistor T33, T32, respectively. The transistors T32 and T33 form a preamplifier stage in which the collector terminals are both connected via resistors R47, R48 respectively, to $V_{CC}$ and to the base terminals of npn transistors T25 and T26. The emitter terminals of T32 and T33 are both coupled to the collector terminal of an npn transistor T17, whose emitter terminal is connected to $V_{EE}$. T25 and T26 form a second stage of the actual-value amplifier, while their collector terminals are coupled to $V_{CC}$ via resistors R49 and R50, respectively. The emitter terminals of T25 and T26 are collectively coupled to the first terminal of a resistor R24. The measuring signal E on the second terminal of R24 is extracted and applied to the variable gain amplifier 2. This terminal of R24 is further connected to the collector terminal of an npn transistor T18 which produces a constant current. For this purpose, the base terminal of T18 is coupled to $V_{BIAS}$ and the emitter terminal, via a resistor R22 to $V_{EE}$. A capacitor C4a is connected in parallel to the series combination formed by T18 and R22.

The collector terminal of T25, T26 respectively, is further connected to the base terminal of an npn transistor T28, T27, respectively. The collector terminals of T27 and T28 are connected to $V_{CC}$. The emitter terminal of T27 is coupled to the collector terminal of an npn transistor T19. The base terminal of T19 is connected to $V_{BIAS}$ and the emitter terminal to $V_{EE}$ via a resistor R26. Accordingly, an npn transistor T20 and the resistor R27 are coupled to the emitter terminal of T28. The collector terminal of T27, T28 respectively, is further connected to the base terminal of an npn transistor T35, T34, respectively. The collector terminal of T34 is connected to $V_{CC}$ via a resistor R51, and the collector terminal of T35 via a resistor R52. The emitter terminal T34, T35 respectively, is connected to the first terminal of a resistor R32, R33 respectively, whose second terminal is coupled to the first terminal of a resistor R400. Instead of the two resistors R32 and R33, it is also possible to use one resistor which is connected with its two terminals to T34 and T35 and to a middle tap to the first terminal of R400. The second terminal of R400 is coupled to the collector of an npn transistor T21, its emitter terminal being coupled to $V_{EE}$. The collector terminal of T34 is further connected to the base terminal of an npn transistor T29 and the collector terminal of T35 to the base terminal of an npn transistor T30. The collector terminal of T29, T30 respectively, is connected to $V_{CC}$ via a resistor R53, R54, respectively. The emitter terminals of T29 and T30 are both connected to the first terminal of a resistor R25, from whose second terminal a reference signal EREF is tapped. This terminal is furthermore coupled to the collector terminal of an npn transistor T22 and, via a capacitor C4, to the second terminal of R24. The base terminal of T22 is connected to $V_{BIAS}$ and the emitter terminal, via a resistor R23, to $V_{EE}$. A capacitor C4b is connected in parallel to the series combination of T22 and R23.

The base terminals of the transistors T17 and T21 working as constant current sources are not directly coupled to $V_{BIAS}$. The base current is produced by means of an npn transistor T53 by a circuit section which will be described in the following. The base terminal of an npn transistor T51 is then connected to $V_{BIAS}$. The emitter terminal of T51 is connected to $V_{EE}$ via a resistor R41, while the collector terminal in this circuit arrangement produces a constant current for the emitter terminal of T53. The collector terminal of T53 is connected to $V_{CC}$. In this manner, a constant base current arises on T53 which is used as a reference for T17 and T21. This current is mirrored by a current mirror formed by pnp transistors T59, T57 and T56 which is controlled by npn transistors T54 and T55 and is stabilized by a capacitor $C_A$, into the base terminals of T17 and T21. For this purpose, the base terminal of T53 is connected to the collector terminal of T59 which forms the primary side of the current mirror. Furthermore, this base terminal is coupled to the base terminal of T54 and, via $C_A$, to the base terminal of T55. The emitter terminal of T59 is connected via a resistor R45 to $V_{CC}$, and the base terminal to the base terminals of the parallel-arranged T56 and T57 which form the secondary side of the current mirror. The emitter terminal of T56 is connected via a resistor R43 to $V_{CC}$, and the collector terminal to the base terminal of T17. Accordingly, the emitter terminal of T57 is coupled via a resistor R44 to $V_{CC}$, and the collector terminal to the base terminal of T21. The collector terminals of T56 and T57 are further connected to $V_{EE}$ each via a smoothing capacitor C1 and C2, respectively.

The collector terminal of T55 is coupled to the base terminal of T59 and to its base terminal, whereas the collector terminal of T54 is connected to $V_{CC}$. The emitter terminals of T54 and T55 are coupled to the collector terminal of an npn transistor T52. The base terminal of T52 is connected to $V_{BIAS}$ and the emitter terminal to $V_{EE}$ via a resistor R42.

In this manner, the power consumption is reduced and a smaller supply voltage $V_{CC}$ can be used. The current mirror for the base current of the reference transistor T53 has certain translation factors for saving current. The control of the current mirror formed by T54 and T55 is known from FIG. 2. The resistor R400 sets the same voltage for the two collectors of T17 and T21, so that the symmetry of the two current sources is improved.

The sensor 3 may thus be subdivided into three essential circuit sections. The measuring path for forming a measuring value E from the applied intermediate frequency signal IF1/IF1X is formed by the emitter follower T23/T24. After that, the signal is applied to the input of the actual-value amplifier formed by preamplifier stage T32/T33 and a second stage T25/T26. The preamplifier stage works linearly while the level on the input of the second stage is usually sufficiently large, so that T25 and T26 work as switches because of the overload. The voltage on the emitter terminals of such a differential stage has a defined value in the state of rest (so-termed state of symmetry) and then rises twice per period of the sine of the radio frequency signal. A measuring signal E is formed in that a low-pass filtering is effected by means of R24 and C4.

This measuring path formed by T23/T24, T32/T33, T25/T26 and R24 is copied once again as a reference path formed by T27/T28, T34/T35, T29/T30 and R25. This not only generates a DC reference, but the reference path processes a radio frequency signal which, as a result of the amplitude limitation, is directly tapped from the measuring path. Since T25/T26 work as switches due to the overload, the voltage drop on R49 and R50 only depends on the current produced by the constant current source T18. This voltage drop determines the input level for the gain in the reference path which generates the reference signal EREF. This current is set so that the reference signal EREF adopts the level at which the intermediate frequency signal IF1/IF1X is to be controlled in the control loop shown in FIG. 1. The advantage of this constructional embodiment having two correlated paths in the sensor 3 lies in the compensation of the temperature ranges and the frequency dependencies of measuring signal E and reference signal EREF. This allows of a frequency-independent level control for the intermediate frequency signal IF1/IF1X.

The difference between the two paths lies in the fact that the measuring signal E has a sinusoidal behavior, whereas the reference signal EREF has ideally a rectangular pattern, because particularly the transistors T34/T35 work as switches due to the overload. Since this would lead to errors in the control, emitter resistors R32 and R33 are used for the adaptation, which resistors obliterate the square-wave signal behavior. Furthermore, by varying the value for R47 and R48, the voltage drop across the resistors and thus the input level for the second stage (T25/T26) of the actual-value amplifier can be set. This provides that the operating point of the transistors (linear range, or saturation range) and thus also the form of the measuring signal E, is determined. With a suitable setting of these variabilities, the paths for the two signals in the sensor 3 may be adapted, so that the amplitude-location curves of E and EREF cross the output signal of the control loop $A_{OUT}$ irrespective of temperature in a selected intersection point. The intermediate frequency signal IF1/IF1X forms the output signal $A_{OUT}$ of the control loop which is applied to the measuring and reference path as an input signal of the sensor 3. If the level of IF1/IF1X is to be set at, for example, a value of 50 mV, IF1/IF1X in the two paths is to be amplified to the same amplitude for E and EREF. This makes the difference between measuring signal and reference signal (E-EREF=0) applied as an input signal to the coupled control loop 2 disappear. These properties of the sensor do not change with the tolerances of integrated resistors and capacitors. Furthermore, also the DC offset voltage between IF1 and IF1X has only a minor influence.

The sensor 3 contains not only the elements R24, R25, C4, C4a and C4b but also a low-pass filter which avoids the variable gain amplifier 2 having too large a dynamic range due to the HF signal.

Figure 5:
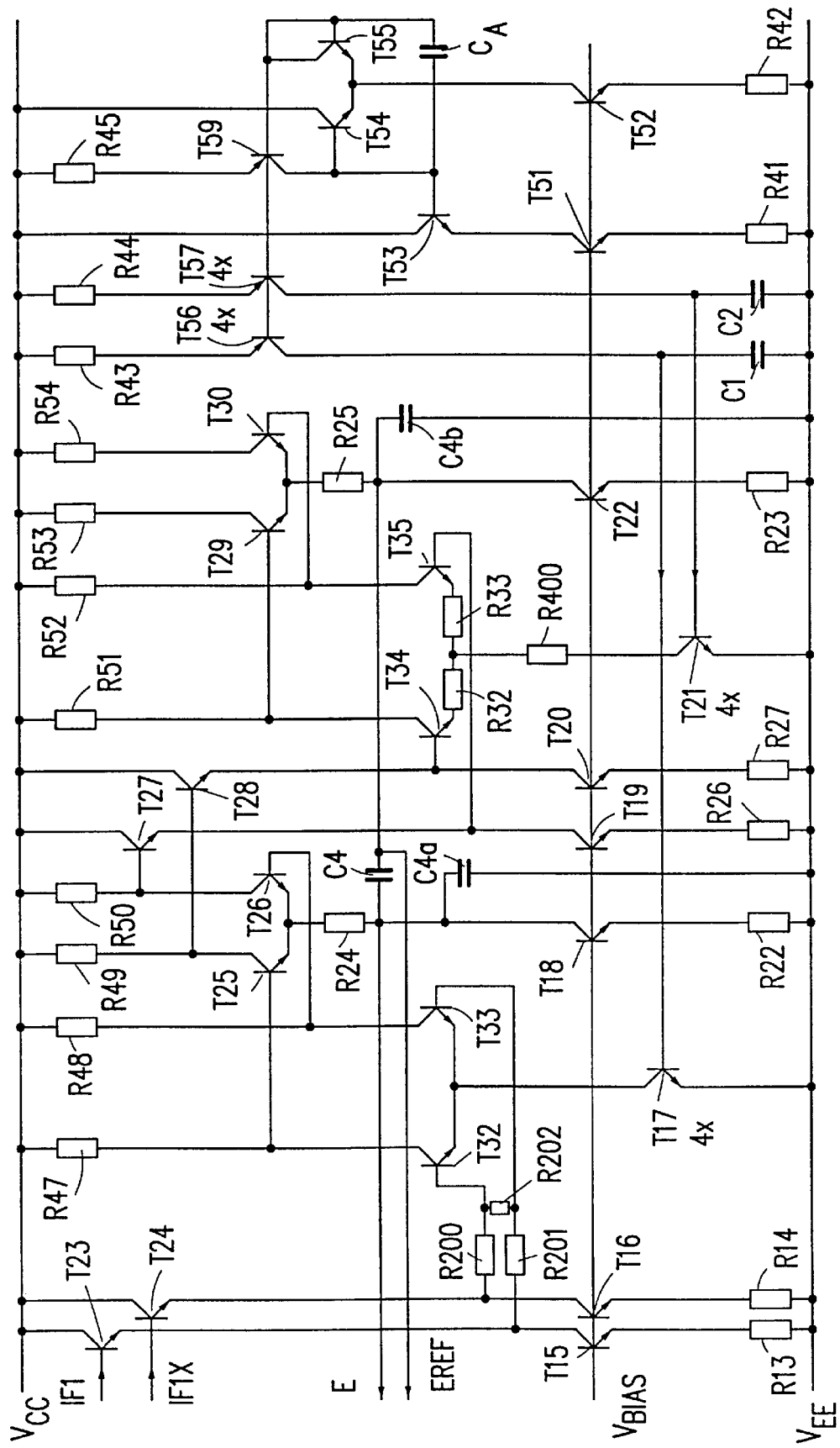
FIG. 5 shows a circuit diagram of the constructional realization of a sensor of the control loop including a voltage divider for adapting the amplitude of the intermediate frequency signal IF1.

A further constructional realization of the sensor 3 of the embodiment for the radio frequency level controller is shown in FIG. 5. Different from FIG. 4, a voltage divider formed by the resistors R200, R201 and R202 is inserted, so that only part of the intermediate frequency signal to be measured is available on the base terminals of T32 and T33. By suitably selecting the resistors R200, R201 and R202, the amplitude of the input signal of the sensor 3 may be set to a selectable value in this manner. Advantageously, the individual resistors can be divided, so that suitable voltage divider ratios can be set. As a result, the sensor 3 may be used for a large range of input signal amplitudes without further elements needing changing.

What is claimed is:

1. A radio frequency level control circuit comprising:
   a level controller which forms an output signal by mixing an input signal and a feedback signal in a Gilbert cell;
   a sensor located in a feedback path of said level controller, said sensor forming a measuring signal and a reference signal from said output signal; and
   a variable gain amplifier located in said feedback path for producing a feedback signal from a difference between said measuring signal and said reference signal;
   wherein said Gilbert cell has a current mirror circuit which is configured to lower a supply voltage of said Gilbert cell, said current mirror circuit being located between a first stage and a second stage of said Gilbert cell, wherein said first stage is coupled to said feedback signal and said second stage is coupled to said input signal.

2. The radio frequency level control circuit of claim 1, wherein said current mirror circuit reflects current from said first stage to said second stage.

3. The radio frequency level control circuit of claim 1, wherein an input of said current mirror circuit is connected to an output of said first stage and an output of said current mirror circuit is connected to said second stage.

4. The radio frequency level control circuit of claim 1, wherein said current mirror circuit comprises at least two series-connected symmetrical current mirrors.

5. The radio frequency level control circuit of claim 1, wherein said current mirror circuit comprises a first current mirror formed by at least two pnp bipolar transistors, and a second current mirror formed by at least two npn bipolar transistors.

6. The radio frequency level control circuit of claim 5, wherein for controlling said first current mirror, a collector terminal and a base terminal of a first control transistor are coupled to an input terminal of the first current mirror, and an emitter terminal of the first control transistor is coupled to a constant power source; and
   a base terminal of a second control transistor is coupled to the input terminal, a collector terminal of the second control transistor is coupled to said supply voltage, and an emitter terminal of the second control transistor is coupled to the constant power source.

7. A mobile radio device having a radio frequency level control circuit, said radio frequency level control circuit comprising:
   a level controller which forms an output signal by mixing an input signal and a feedback signal in a Gilbert cell;
   a sensor located in a feedback path of said level controller, said sensor forming a measuring signal and a reference signal from said output signal; and
   a variable gain amplifier located in said feedback path for producing a feedback signal from a difference between said measuring signal and said reference signal;
   wherein said Gilbert cell has a current mirror circuit which is configured to lower a supply voltage of said Gilbert cell, said current mirror circuit being located between a first stage and a second stage of said Gilbert cell, wherein said first stage is coupled to said feedback signal and said second stage is coupled to said input signal.

8. The mobile radio device of claim 7, wherein said current mirror circuit reflects current from said first stage to said second stage.

9. The mobile radio device of claim 7, wherein an input of said current mirror circuit is connected to an output of said first stage and an output of said current mirror circuit is connected to said second stage.

10. A circuit arrangement having a Gilbert cell for mixing a feedback signal with an input signal to form an output signal, wherein said Gilbert cell comprises:

a first stage coupled to the feedback signal, said feedback signal being a difference between said output signal and a reference signal;

a second stage coupled to the input signal; and at least one current mirror circuit located between said first stage and said second stage; said at least one current mirror circuit being configured to lower a supply voltage of said Gilbert cell.

11. The circuit arrangement of claim 10, wherein said at least one current mirror circuit reflects current from said first stage to said second stage.

12. The circuit arrangement circuit of claim 10, wherein an input of said at least one current mirror circuit is connected to an output of said first stage and an output of said at least one current mirror circuit is connected to said second stage.

* * * * *